United States Patent
Yano et al.

(10) Patent No.: US 6,740,590 B1
(45) Date of Patent: May 25, 2004

(54) AQUEOUS DISPERSION, AQUEOUS DISPERSION FOR CHEMICAL MECHANICAL POLISHING USED FOR MANUFACTURE OF SEMICONDUCTOR DEVICES, METHOD FOR MANUFACTURE OF SEMICONDUCTOR DEVICES, AND METHOD FOR FORMATION OF EMBEDDED WRITING

(75) Inventors: Hiroyuki Yano, Yokohama (JP); Gaku Minamihaba, Yokohama (JP); Yukiteru Matsui, Yokohama (JP); Katsuya Okumura, Yokohama (JP); Akira Iio, Tokyo (JP); Masayuki Hattori, Tokyo (JP)

(73) Assignees: Kabushiki Kaisha Toshiba, Kawasaki (JP); JSR Corporation, Tokyo (JP)

( * ) Notice: Subject to any disclaimer, the term of this patent is extended or adjusted under 35 U.S.C. 154(b) by 0 days.

(21) Appl. No.: 09/531,163

(22) Filed: Mar. 17, 2000

(30) Foreign Application Priority Data

| Mar. 18, 1999 | (JP) | ............................................. | 11-074052 |
| Mar. 18, 1999 | (JP) | ............................................. | 11-074561 |
| Mar. 18, 1999 | (JP) | ............................................. | 11-074562 |

(51) Int. Cl.$^7$ ............................................. H01L 21/302
(52) U.S. Cl. ........................ 438/692; 438/693; 51/309
(58) Field of Search ................................. 438/691–693; 215/88, 89; 51/509, 309

(56) References Cited

U.S. PATENT DOCUMENTS

| 5,527,423 | A |   | 6/1996 | Neville et al. | ............ | 156/656.1 |
| 5,728,308 | A |   | 3/1998 | Muroyama | | |
| 5,738,800 | A | * | 4/1998 | Hosali et al. | ............... | 216/89 |
| 5,876,490 | A | * | 3/1999 | Ronay | ............... | 51/509 |
| 5,916,819 | A | * | 6/1999 | Skrovan et al. | ............. | 438/692 |
| 6,232,231 | B1 | * | 5/2001 | Sethuraman et al. | ........ | 438/691 |

FOREIGN PATENT DOCUMENTS

| EP | 0 708 160 | 4/1996 |
| EP | 0 846 740 | 6/1998 |
| JP | 62-102543 | 5/1987 |
| JP | 64-55845 | 3/1989 |

(List continued on next page.)

OTHER PUBLICATIONS

Rodel Nitta Product Catalog "Planarization Systems CMP".
Rodel Product Catalog—JP "Planarization Systems Slurrie Pads Fixturing".

(List continued on next page.)

*Primary Examiner*—Nadine Norton
*Assistant Examiner*—Duy-Vu Deo
(74) *Attorney, Agent, or Firm*—Oblon, McClelland, Maier & Neustadt, P.C.

(57) ABSTRACT

The object of the present invention is to provide an aqueous dispersion that can give the required properties for a wide range of uses including electronic materials, magnetic materials, optical materials and polishing materials, and to provide an aqueous dispersion for chemical mechanical polishing (CMP slurry) that gives an adequate polishing rate without creating scratches in polishing surfaces. Another object of the present invention is, to provide a method for manufacture of semiconductor devices using a CMP slurry that can control progressive erosion due to scratches and the like during polishing and that can achieve efficient flattening of working films, and to provide a method for formation of embedded wiring. The aqueous dispersion or CMP slurry of the present invention contains polymer particles made of thermoplastic resins or the like, and inorganic particles made of alumina, silica or the like, wherein the zeta potentials of the polymer particles and inorganic particles are of opposite signs, and they are bonded by electrostatic force to form aggregates as composite particles. The aggregates are subjected to ultrasonic wave irradiation or shear stress with a homogenizer to give more uniformly dispersed composite particles.

22 Claims, 7 Drawing Sheets

FOREIGN PATENT DOCUMENTS

| | | |
|---|---|---|
| JP | 05-275366 | 10/1993 |
| JP | 07-86216 | 3/1995 |
| JP | 08-17831 | 1/1996 |
| JP | 08-197414 | 8/1996 |
| JP | 08-510437 | 11/1996 |
| JP | 09-143455 | 6/1997 |
| JP | 09-285957 | 11/1997 |
| JP | 10-44047 | 2/1998 |

OTHER PUBLICATIONS

Patent Abstracts of Japan, vol. 1997, No. 10, Oct. 31, 1997, JP 09 143455, Jun. 3, 1997.

Patent Abstracts of Japan, vol. 13, No. 071 (M–799), Feb. 17, 1989, JP 63 272460, Nov. 9, 1998.

Patent Abstracts of Japan, vol. 1998, No. 11, Sep. 30, 1998, JP 10 152673, Jun. 9, 1998.

* cited by examiner

AQUEOUS DISPERSION, AQUEOUS DISPERSION FOR CHEMICAL MECHANICAL POLISHING USED FOR MANUFACTURE OF SEMICONDUCTOR DEVICES, METHOD FOR MANUFACTURE OF SEMICONDUCTOR DEVICES, AND METHOD FOR FORMATION OF EMBEDDED WRITING

BACKGROUND OF THE INVENTION

1. Technical Field of the Invention

The present invention relates to an aqueous dispersion containing polymer particles and inorganic particles. The polymer particles and inorganic particles in the aqueous dispersion of the present invention are included as composite particles (aggregates). The composite particles of the present invention have adequate strength and hardness and excellent heat resistance, and the aqueous dispersion can be utilized for cosmetics, electronic materials, magnetic materials, coating materials, paints, optical materials, catalysts, photocatalysts, electronic material film lubricants, diagnostic agents, drugs, conductive materials, inks and the like, and can also be used as a polishing material for magnetic disks and the like.

Another aspect of the present invention relates to an aqueous dispersion for chemical mechanical polishing (hereunder referred to as "CMP") employed in the manufacture of semiconductor devices. More specifically, the present invention relates to an aqueous dispersion that is useful for CMP of semiconductor device working films, and that contains polymer particles, inorganic particles and water, wherein the zeta potentials of the particles are of opposite signs.

Yet another aspect of the present invention relates to an aqueous dispersion containing water and composite particles that consist of polymer particles and inorganic particles bonded by electrostatic force, and to an aqueous dispersion that is suitable for CMP of semiconductor device working films.

Still another aspect of the present invention relates to an aqueous dispersion containing composite particles wherein the polymer particles and inorganic particles have zeta potentials of opposite signs and the particles are bonded by electrostatic force, and to an aqueous dispersion that is suitable for CMP of semiconductor device working films.

Still another aspect of the invention relates to a method for manufacture of semiconductor devices, and more specifically to a method for formation of embedded wiring mounted on DRAMs and high-speed logic LSIs by CMP and to a method for manufacture of semiconductor devices using the technique.

2. Prior Art

For such uses as standard particles, diagnostic agent carrier particles, lubricants and the like, it has been conventional to use polymer particles with a narrow particle size distribution obtained by copolymerizing vinyl monomers or the like, in such forms as aqueous dispersions. However, the polymer particles do not always have sufficient strength and heat resistance, and when used as standard particles or lubricants, application of excessive shear stress or exposure to high temperature can cause deformation or destruction of the particles, and therefore their uses are limited. In order to deal with these problems there have been proposed particles made of copolymers of crosslinkable vinyl monomers, for example, that are copolymerized with a high degree of crosslinking. However, particles made of such crosslinked polymers have lower hardness and insufficient heat resistance compared to inorganic-based particles, and therefore cannot be made into aqueous dispersions that are suitable for a very wide range of uses.

For uses such as electronic materials, magnetic materials, optical materials, polishing materials and the like there have been employed aqueous dispersions containing particles made of various metal compounds, and a variety of composite particles have been proposed for diverse purposes. As such types of composite particles there may be mentioned composite particles comprising iron oxide particles coated with silicon compounds, so that in production of filamentous magnetic bodies by heat treatment it is possible to prevent shape collapsing and sintering between magnetic bodies; composite particles comprising iron powder coated with copper as a high strength material for powder metallurgy; and composite particles comprising iron oxide particles coated with antimony oxide and aluminum oxide for improved heat resistance. However, since such composite particles are all composed of metal compounds, they are too hard and are not always adequately suited for diverse purposes. The development of composite particles with appropriate hardness has thus become a necessity particularly in the fields of electronic materials, magnetic materials, optical materials, polishing materials, and so forth.

Improvements in degrees of semiconductor device integration and increased multilayer wiring have led to the introduction of CMP techniques for polishing of working films and the like. As disclosed in Japanese Laid-open Patent Publication No. Sho-62-102543, No. Sho-64-55845 and No. Hei-5-275366, Japanese Patent Public Inspection No. Hei-8-510437, and Japanese Laid-open Patent Publication No. Hei-8-17831, No. Hei-8-197414 and No. Hei-10-44047, there are known methods whereby wiring is formed by embedding a wiring material such as tungsten, aluminum or copper in a hole or trench formed in the insulation film of a process wafer, and then polishing to remove the excess wiring material.

In CMP it has been conventional to use polishing materials that are aqueous dispersions containing abrasive particles made of metal oxides. However, these abrasive particles present a problem in that their high hardness creates scratches in the polishing surface. Such scratches created during the CMP step are undesirable because they lower the reliability of the resulting LSI. In order to prevent creation of such scratches, Japanese Laid-open Patent Publication No. Hei-9-285957 has proposed a polishing material comprising abrasive particles such as colloidal silica, and including scratch-preventing particles made of polyurethane resin or the like with a larger particle size than the abrasive particles. However, using polishing materials containing scratch-preventing particles with a large particle size and low hardness has resulted in the problem of vastly reduced polishing rate compared to polishing materials containing metal oxide abrasive particles.

In recent years, more attention is being focused on achieving lower permittivities of interlayer insulation films for the purpose of improving VLSI performance. For lower permittivity there have been developed interlayer insulation films comprising fluorine-containing $SiO_2$ (permittivity: approximately 3.3–3.5), polyimide-based resins (permittivity: approximately 2.4–3.6, trade name "PIQ" by Hitachi Chemical Industries Co., Ltd.; trade name "FLARE" by Allied Signal Corporation, and the like), benzocyclobutene (permittivity: approximately 2.7, trade name "BCB" by Dow Chemical Corporation, and the like), hydrogen-containing SOG (permittivity: approximately 2.5–3.5) and organic SOG (permittivity: approximately 2.9, trade name "HSGR7" by Hitachi Chemical Industries Co., Ltd.) and the like, instead of high-permittivity $SiO_2$ films. However, because these insulation films have lower mechanical strength than $SiO_2$ films and are soft and brittle, polishing by using conventional aqueous dispersions containing inorganic particles has resulted in wire breakage by creation of scratches, and this has led to further decreasing yields.

Japanese Laid-open Patent Publication No. Hei-7-86216 describes a polishing material containing abrasive particles composed mainly of an organic polymer compound or the like instead of abrasive particles made of a metal oxide. It is explained that using the polishing material for polishing of semiconductor device working films can prevent generation of scratches in polishing surfaces. However, abrasive particles made of such organic polymer compounds have low hardness, and polishing materials containing these abrasive particles as main components also give vastly lower polishing rates compared to polishing materials containing abrasive particles made of metal oxides.

Thus, the materials described in these publications cannot achieve highly reliable high-speed polishing of working films in the manufacture of semiconductor devices, nor do they allow highly efficient fabrication of semiconductor devices.

In recent years, the field of semiconductor device manufacture has seen increased miniaturization and higher density, and this has led to research and development of a variety of microengineering techniques. One of these techniques, CMP is an important indispensable technique for formation of embedded metal wiring (damascene wiring).

According to the prior art, techniques for polishing of metals by CMP (metal CMP) have employed slurries based on inorganic particles such as alumina or silica. Here, hard polishing pads with low elastic deformation are used in order to control erosion, but since the elasticity of the abrasive particles themselves is poor, a problem occurs as scratches are produced in the wiring. In addition, the abrasive grains concentrate in the scratches so that the scratched portions are enlarged making it impossible to control erosion.

On the other hand, research is also progressing on slurries using polymer particles such as resins. Polymer particles are characteristically softer than inorganic particles. This provides an advantage since the particles themselves exhibit elasticity, thus allowing scratches to be avoided even when a hard polishing pad is used. However, because the particles have virtually no polishing ability, slurries employing polymer particles alone have not been of a practical level.

SUMMARY OF THE INVENTION

Problems to be Solved by the Invention

It is an object of the present invention to overcome the aforementioned problems of the prior art by providing an aqueous dispersion containing composite particles that are aggregates of polymer particles and inorganic particles, and exhibit sufficient strength and hardness, excellent heat resistance and appropriate plasticity. The aqueous dispersion is useful for a wide range of purposes including electronic materials, magnetic materials and optical materials, and can be used for polishing of magnetic disks and the like.

It is an object of another aspect of the present invention to overcome the aforementioned problems of the prior art by providing an aqueous dispersion for CMP (hereunder referred to as "CMP aqueous dispersion") that can accomplish polishing of semiconductor device working films at an adequate rate, and that can be used in the manufacture of semiconductor devices without creating scratches in polishing surfaces.

It is another object of the present invention to provide a method for manufacture of semiconductor devices using a CMP slurry that can control progressive erosion due to scratches and the like during polishing, and that can achieve efficient flattening of working films.

It is still another object of the present invention to provide a method for formation of satisfactory embedded wiring that can control progressive erosion due to scratches and the like during polishing, and that can achieve efficient flattening of working films.

Features of the Invention

The present invention has been accomplished upon the discovery that in an aqueous dispersion containing specific polymer particles and inorganic particles, adjustment of the pH for an aqueous dispersion wherein the polymer particles and inorganic particles have zeta potentials of opposite signs results in electrostatic aggregation of these particles causing them to combine together, to give an aqueous dispersion that is useful for the various purposes mentioned above.

An aqueous dispersion according to the first aspect of the present invention is characterized by containing polymer particles, inorganic particles and water, wherein the zeta potential of the polymer particles and the zeta potential of the inorganic particles are of opposite signs.

An aqueous dispersion according to the second aspect of the present invention is characterized by containing polymer particles, inorganic particles and water, wherein the polymer particles and the inorganic particles are electrostatically bonded to form composite particles.

An aqueous dispersion according to the third aspect of the present invention is characterized by containing polymer particles, inorganic particles and water, wherein the zeta potential of the polymer particles and the zeta potential of the inorganic particles are of opposite signs, and the polymer particles and the inorganic particles are electrostatically bonded to form composite particles.

An aqueous dispersion according to the fourth aspect of the present invention is characterized by containing polymer particles, inorganic particles and water, wherein the zeta potential of the polymer particles and the zeta potential of the inorganic particles are of opposite signs, the polymer particles and the inorganic particles are electrostatically bonded to form composite particles, the composite particles are obtained after ultrasonic irradiation treatment or mechanical shear stress treatment with a homogenizer, and the mean particle size of the composite particles is not greater than 1 µm.

A CMP aqueous dispersion used for the manufacture of semiconductor devices according to the fifth aspect of the present invention is characterized by containing polymer particles, inorganic particles and water, wherein the zeta potential of the polymer particles and the zeta potential of the inorganic particles are of opposite signs.

A CMP aqueous dispersion used for the manufacture of semiconductor devices according to the sixth aspect of the present invention is characterized by containing polymer particles, inorganic particles and water, wherein the polymer particles and the inorganic particles are electrostatically bonded to form composite particles.

A CMP aqueous dispersion used for the manufacture of semiconductor devices according to the seventh aspect of the present invention is characterized by containing polymer particles, inorganic particles and water, wherein the zeta potential of the polymer particles and the zeta potential of the inorganic particles are of opposite signs, and the polymer particles and the inorganic particles are electrostatically bonded to form composite particles.

A CMP aqueous dispersion used for the manufacture of semiconductor devices according to the eighth aspect of the present invention is characterized by containing polymer particles, inorganic particles and water, wherein the zeta potential of the polymer particles and the zeta potential of the inorganic particles are of opposite signs, the polymer particles and the inorganic particles are electrostatically bonded to form composite particles, the composite particles are obtained after ultrasonic irradiation treatment or mechanical shear stress treatment with a homogenizer, and the mean particle size of the composite particles is not greater than 1 $\mu$m.

A method for manufacture of semiconductor devices according to the ninth aspect of the present invention is characterized by using a CMP slurry containing aggregates comprising polymer particles and inorganic particles adsorbed onto the polymer particles.

A method for manufacture of semiconductor devices according to the tenth aspect of the present invention is characterized by using a CMP slurry containing aggregates comprising polymer particles, a surfactant adsorbed onto the polymer particles, and inorganic particles adsorbed onto the surfactant.

A method for formation of embedded wiring according to the eleventh aspect of the present invention is characterized by using a CMP slurry containing aggregates comprising polymer particles and inorganic particles adsorbed onto the polymer particles.

A method for formation of embedded wiring according to the twelfth aspect of the present invention is characterized by using a CMP slurry containing aggregates comprising polymer particles, a surfactant adsorbed onto the polymer particles, and inorganic particles adsorbed onto the surfactant.

Effect of the Invention

When an aqueous dispersion according to the present invention is used for polishing of various polishing films, the polishing rate is high and there is no scratching of the polishing surface. The aqueous dispersion of the present invention is useful for a wide range of purposes including electronic materials, magnetic materials and optical materials, and can be used as a polishing material for polishing of magnetic disks and the like.

When a CMP aqueous dispersion according to the present invention is used as a polishing material for polishing of semiconductor device working films, the polishing rate is high and there is no scratching of the polishing surface.

By applying the method for manufacture of semiconductor devices or the method for formation of embedded wiring of the present invention it is possible to suppress progressive erosion during polishing due to scratching and the like, and to achieve more efficient flattening of working films.

As a result, it is possible to stably form embedded wiring with low scratching and erosion, thus allowing highly reliable semiconductor devices to be obtained more easily.

DETAILED DESCRIPTION OF THE INVENTION

The present invention will now be explained in greater detail.

As the "polymer particles" there may be used polymer particles comprising thermoplastic resins such as (1) polystyrene and styrene-based copolymers, (2) (meth)acrylic resins such as polymethyl methacrylate and polymethyl acrylate, and acrylic-based copolymers, (3) polyvinyl chloride, polyacetal, saturated polyester, polyamide, polyimide, polycarbonate and phenoxy resins, and (4) polyolefins such as polyethylene, polypropylene, poly-1-butene, poly-4-methyl-1-pentene, and olefin-based copolymers.

These polymer particles that are used may be composed of a polymer with a crosslinked structure, obtained by copolymerization of styrene, methyl methacrylate, methyl acrylate or the like with divinylbenzene, ethyleneglycol dimethacrylate or the like. The hardness of the polymer particles may be adjusted by the degree of crosslinking. There may also be used polymer particles composed of thermosetting resins such as phenol resin, urethane resin, urea resin, melamine resin, epoxy resin, alkyd resin or unsaturated polyester resin.

Copolymers with hydrophilic functional groups in the structural units, such as styrene-methacrylic acid and/or acrylic acid copolymer, styrene-maleic anhydride copolymer and the like, exhibit satisfactory dispersion in water, and are preferred as they allow easy preparation of aqueous dispersions to be used as polishing materials and the like. Also, polyethylene, polypropylene, polystyrene or the like may be surface treated with, for example, oxygen plasma to produce hydrophilic functional groups for improved dispersability in water, thereby allowing easier preparation of aqueous dispersions.

The form of the polymer particles is preferably spherical. Here, "spherical" means roughly spherical with no acute angle portions, and not necessarily near-perfect spheres. Using spherical polymer particles will allow polishing at an adequate rate, with no scratching of the polishing surface during polishing, particularly when they are used as a polishing material for magnetic disks, semiconductor device working films, and the like.

The "inorganic particles" used may be inorganic particles composed of metal oxides such as alumina, silica, titania, zirconia, ceria, iron oxide and manganese oxide.

These polymer particles and inorganic particles may be of a single type, or two or more types may be used in combination.

According to the present invention, the "zeta potential" of the polymer particles will usually be negative across the entire pH range, or across a wide pH range except for the low pH range; however, by using polymer particles with specific functional groups it is possible to obtain polymer particles with a more definite negative zeta potential.

Figure 1:
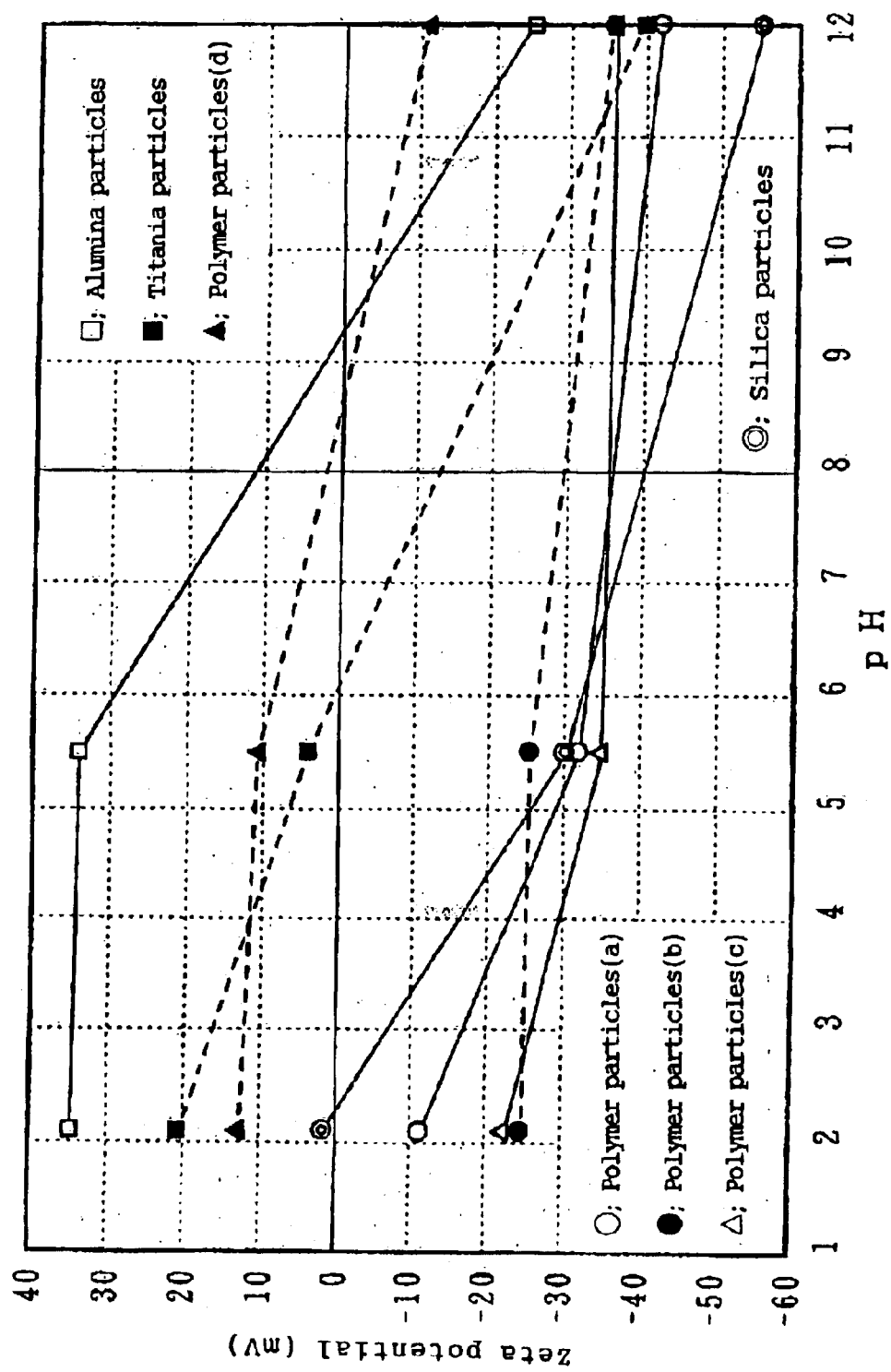
FIG. 1 is a graph showing the relationship between pH and zeta potential for an aqueous dispersion containing dispersed polymer particles and inorganic particles.

Depending on the type of functional groups, it is also possible to obtain polymer particles with a positive zeta potential in specific pH ranges (see FIG. 1).

On the other hand, while the inorganic particles will usually have a positive zeta potential across a relatively wide pH range, some are known with negative zeta potentials across a relatively wide pH range (see FIG. 1).

Consequently, by combining specific polymer particles and inorganic particles and adjusting the pH of the aqueous dispersion containing the particles, it is possible to obtain an aqueous dispersion (or CMP aqueous dispersion) wherein the zeta potentials of the polymer particles and the inorganic particles are "of opposite signs".

When the zeta potentials of the polymer particles and the inorganic particles are thus of opposite signs, the particles aggregate due to electrostatic force, combining together to form composite particles.

The aqueous dispersion of the present invention can be prepared in such a manner as to contain polymer particles that are modified by specific functional groups to have a negative zeta potential in virtually all pH ranges, and either or both alumina particles or titania particles as the inorganic particles.

As polymer particles modified to have a negative zeta potential, there may be used polymer particles wherein at least one from among carboxyl groups and their anions and sulfonic acid groups and their anions, has been introduced into the molecular chain.

The aqueous dispersion is used after adjustment to a pH range in which the zeta potential of the inorganic particles is positive, i.e. to a range which is more acidic than the isoelectric point thereof. The pH of the aqueous dispersion is preferably in a lower range under the isoelectric point, as such a low pH range will raise the zeta potential of the inorganic particles for stronger aggregation between the polymer particles and inorganic particles, so that the particles will not easily separate during use even when a considerably large shear stress is applied to the aggregates. When used in a range that is more basic than the isoelectric point of the inorganic particles, the zeta potential of the inorganic particles becomes negative, making it difficult to achieve aggregation between the polymer particles and inorganic particles according to the object of the present invention.

On the other hand, since polymer particles with the zeta potential adjusted by specific functional groups have a higher zeta potential with lower pH (the absolute value decreases at the negative end), it is not preferred for the pH to be in too low a range, and therefore the pH of the aqueous dispersion is preferably 2 or higher, and more preferably 3 or higher.

With these considerations, when alumina particles are used as the inorganic particles, the pH range of the aqueous dispersion is preferably 2–9, more preferably 3–8 and most preferably 3–7 (see FIG. 1). When titania is used for the inorganic particles, the pH range is preferably 2–6, and more preferably 3–5 (see FIG. 1).

The aqueous dispersion or CMP aqueous dispersion of the present invention may contain polymer particles modified by specific functional groups so that the zeta potential is positive, and inorganic particles that are either or both silica particles and zirconia particles.

As polymer particles modified for a positive zeta potential, there may be used polymer particles wherein at least one from among cation-formable nitrogen-containing groups and their cations, has been introduced into the molecular chain. Cation-formable nitrogen-containing groups are groups that form nitrogen cations with acids, and otherwise they are not particularly restricted. As examples there may be mentioned amino groups (where "amino group" is used in the wide sense to include primary, secondary or tertiary, and linear or ring-forming moieties), imino groups, pyridinylic groups (pyridinyl groups or groups comprising pyridine derivatives), and the like. Preferred among these are groups that are stable and readily form cations. There are no particular restrictions on the source of the group used, and for example, nitrogen-containing monomers or azo-based polymerization initiators may be used.

This aqueous dispersion is used after adjustment to a pH range in which the zeta potential of the inorganic particles is negative, i.e. to a range which is more basic than the isoelectric point thereof. The pH of the aqueous dispersion is preferably in a higher range above the isoelectric point. Such a high pH range will lower the zeta potential of the inorganic particles (increasing the absolute value toward the negative end), for stronger aggregation between the polymer particles and inorganic particles, so that the particles will not easily separate during use even when a considerably large shear stress is applied to the aggregates. When used in a range that is more acidic than the isoelectric point of the inorganic particles, the zeta potential of the inorganic particles becomes positive, making it difficult to achieve aggregation between the polymer particles and inorganic particles according to the object of the present invention.

On the other hand, since polymer particles modified for a positive zeta potential by specific functional groups have a lower zeta potential with increasing pH (the absolute value decreases at the positive end), it is not preferred for the pH to be in too high a range. Since the isoelectric point of the polymer particles differs depending on the type of specific functional groups the pH of the aqueous dispersion will also differ depending on the type, but the pH of the aqueous dispersion will usually be not higher than 8, and preferably not higher than 7.

With these considerations, when silica particles are used as the inorganic particles, the pH range of the aqueous dispersion is preferably 2.5–10, more preferably 2.5–8.5 and most preferably 3–8. When zirconia is used for the inorganic particles, the pH range is preferably 4–10, more preferably 4–8.5, and even more preferably 5–8.

According to the present invention, at least one from among ester groups, amide groups, hydroxyl groups and ether groups (functional groups with polyethylene glycol chains and the like) may also be introduced into the polymer particles. This offers the advantage of preventing the phenomenon of foaming during mixture with the inorganic particles.

The preferred range for the mean particle size of the polymer particles and inorganic particles according to the present invention is 0.01–1.0 µm, preferably 0.01–0.5 µm, and especially 0.01–0.3 µm, for each.

The preferred range for the mean particle size of the aggregates formed by aggregation of these particles is 0.1–10 µm, preferably 0.1–5µm, and especially 0.1–1 µm, with 0.1–0.8 µm being most preferred. The mean particle size of the aggregates is preferably not less than 0.1 µm because this will not give the properties required for various uses such as electronic materials, magnetic materials, optical materials, polishing materials and the like. On the other hand, If the mean particle size of the aggregates exceeds 10 µm, the aggregates will tend to subside as sediment, thus hampering efforts to achieve a stable aqueous dispersion. The mean particle size can be measured by observation with a transmission electron microscope.

For aggregates with the specified structure, the mean particle size of the inorganic particles is preferably smaller than the mean particle size of the polymer particles, and the ratio of the mean particle size of the polymer particles (Sp) and the mean particle size of the inorganic particles (Si) is preferably such that Sp/Si=1–40, especially 1.5–20, and more preferably 2–10. If the ratio of the mean particle sizes of the polymer particles and inorganic particles is within this range, it will be possible to achieve aggregates with numerous small-sized inorganic particles attached over a wide area of the surfaces of large-sized polymer particles. In an aqueous dispersion or CMP aqueous dispersion containing aggregates of this kind, the polymer particles at the center will tend to deform and flatten during use, so that the polymer particles and inorganic particles will not easily separate even when the aggregates are subjected to large shear stress or the like. In a CMP aqueous dispersion containing such aggregates, the polymer particles at the center will tend to deform and flatten during polishing, and the relatively small-sized inorganic particles will contact with the polishing surface. Consequently, scratching of the polishing surface is minimized while polishing can be efficiently accomplished at an adequate rate. If the Sp/Si ratio is less than 1, scratches may be produced in the polishing surface, whereas if it is greater than 40 the polishing rate may tend to be reduced.

According to the present invention, the required amounts of the polymer particles and inorganic particles in the aqueous dispersion will differ depending on the purpose of use, but if the aqueous dispersion is defined as 100 parts by weight (hereunder referred to simply as "parts"), they may each generally be 0.1–40 parts, especially 0.2–30 parts, and more preferably 0.3–20 parts. The total amount of the polymer particles and inorganic particles may be 0.2–40 parts, especially 0.4–30 parts, and more preferably 1.0–20 parts. The contents of the polymer particles and inorganic particles and their total are preferably not below these lower limits, because it will not be possible to achieve the desired properties for various purposes. On the other hand, at above these upper limits, excessive aggregation of the particles will reduce the flow property, thus hampering efforts to achieve a stable aqueous dispersion.

There are no particular restrictions on the weight ratio of the polymer particles and inorganic particles, but the ratio of the polymer particle content (Wp) and the inorganic particle content (Wi), or Wp/Wi, is preferably 0.01–4, especially 0.02–2, and more preferably 0.05–1. A weight ratio of polymer particles and inorganic particles within this range can give aggregates with a structure in which multiple inorganic particles are attached to the surface of the polymer particles, while allowing efficient polishing at an adequate rate and minimizing scratching of the polishing surface. In particular, a ratio in the range of 0.05–1 will reliably give aggregates with this structure. A Wp/Wi ratio of less than 0.01 is not preferred as it may result in scratching of polishing surfaces, nor is a ratio exceeding 4 as this will tend to reduce the polishing rate.

The aqueous dispersion of the present invention can be prepared by admixture of ion-exchanged water or the like to the polymer particles and inorganic particles. It can, also be prepared by mixing a aqueous dispersion containing the polymer particles (the polymer particles-containing aqueous dispersion) and an aqueous dispersion containing the inorganic particles (the inorganic particles-containing aqueous dispersion). These preparation methods are preferred for their simplicity. The aqueous dispersion can also be prepared by producing a polymer particles-containing aqueous dispersion and combining the inorganic particles with this aqueous dispersion. It can also be prepared by producing an inorganic particles-containing aqueous dispersion and combining the polymer particles with this aqueous dispersion. The medium for the aqueous dispersion may be water or a mixed medium composed mainly of water, such as water and methanol, but water alone is particularly preferred.

The aqueous dispersion prepared in the manner described above may be irradiated with ultrasonic waves or subjected to mechanical shear stress with a homogenizer or the like, to achieve greater fineness of the polymer particles and inorganic particles while causing reformation of composite particles by electrostatic rebonding, as well as uniform redispersion. Since the composite particles prepared by this method are extremely fine and uniformly dispersed, the aqueous dispersion containing the composite particles exhibit particularly excellent performance for various uses, and can be stored in a stable condition over long periods.

The method for producing a polymer particles-containing aqueous dispersion, that is used to prepar the aqueous dispersion of the present invention, is most conveniently a method whereby an aqueous medium is used for polymerization of a prescribed monomer, or for copolymerization with other monomers if necessary, and the aqueous medium containing the resulting polymer particles is directly used as the polymer particles-containing aqueous dispersion. The polymer particles-containing aqueous dispersion may also be prepared by a method whereby an aqueous medium or organic solvent is used for polymerization followed by drying, pulverization, and the like., after which the resulting powder is redispersed in the aqueous medium. Even when an organic solvent has been used for polymerization, a polymer particles-containing aqueous dispersion can be easily produced by solvent substitution with an aqueous medium by distillation or the like, if a particular polymer is to be produced.

The inorganic particles-containing aqueous dispersion can also be produced by a method such as described in the specification of Japanese Patent Application No. hei-9-214035 or No. hei-9-238969. For example, it may be produced by a method whereby the inorganic particles are added to distilled water while stirring and kneading with a kneader, and after completing the addition, the kneading procedure and dispersing procedure are continued and the resulting slurry is diluted with ion-exchanged water or the like, and if necessary, the coarse particles are subsequently removed.

Commercially available fumed alumina particles, fumed silica particles or the like may be used as the inorganic particles, and these may be combined with ion-exchanged water, distilled water or the like to prepare an aqueous dispersion.

According to the present invention, the aqueous dispersion or CMP slurry may also contain, if necessary, various other additives (for example, oxidizing agents, polyvalent metal ion, organic acids, surfactants, pH regulators, and the like.). Such addition can increase the polishing rate, stabilize the oxidizing agent, and adjust for differences in the polishing rate when polishing films of different hardness, as in cases where two or more working films are polished.

Inclusion of potassium hydroxide or ammonia allows polishing of insulating films, and inclusion of etching agent such as oxidizing agent and/or acid and the like allows polishing of metal films made of tungsten, aluminum, copper and the like. The aqueous dispersion or CMP slurry (particularly a CMP slurry) can also be used in combination with another aqueous dispersion or CMP slurry (especially a CMP slurry) in an appropriate weight ratio.

The "oxidizing agent" used is not particularly restricted so long as it is water-soluble, and it is preferably selected as appropriate depending on the electrochemical properties of the metal layer of the film target and the like of the wafer, based on a Pourbaix diagram, for example.

As specific oxidizing agents there may be mentioned organic peroxides such as hydrogen peroxide, peracetic acid, perbenzoic acid, tert-butylhydroperoxide, and the like.; permanganate compounds such as potassium permanganate, and the like.; bichromate compounds such as potassium bichromate, and the like.; halogenate compounds such as potassium iodate, and the like.; nitric compounds such as nitric acid, iron nitrate, and the like.; perhalogenate compounds such as perchloric acid, and the like.; transition metal salts such as potassium ferricyanide, and the like.; persulfuric compounds such as ammonium persulfate, and the like.; polyvalent metal salts such as iron nitrate, cerium ammonium nitrate, and the like.; and heteropoly acids such as silicotungstic acid, phosphotungstic acid, silicomolybdic acid, phosphomolybdic acid, and the like. Two or more of these may also be used in combination. Among these, hydrogen peroxide and organic peroxides are particularly preferred because they contain no metal elements and their decomposition products are harmless. By including such oxidizing agents it is possible to vastly increase the polishing rate for polishing of metal layers, and particularly of target films of semiconductor devices.

The oxidizing agent content may be 0.1–15 parts, and is particularly preferred to be 0.3–10 parts and especially 0.5–8 parts, with respect to 100 parts of the aqueous dispersion. When this content is less than 0.1 part, the polishing rate of the aqueous dispersion will not be adequately enhanced, while, when it is included at greater than 15 parts, it is possible to adequately increase the polishing rate and it is not necessary to be preferably included in large quantities such as greater than 15 parts.

A polyvalent metal ion may also be added. As polyvalent metal ions there may be mentioned metal ions of aluminum, titanium, vanadium, chromium, manganese, iron, cobalt, nickel, copper, zinc, germanium, zirconium, molybdenum, tin, antimony, tantalum, tungsten, lead and cerium. One single species may be used, or two or more polyvalent metal ions may be used together. Particularly preferred as polyvalent metal ions are one or more metal ions of aluminum, titanium, chromium, manganese, iron, copper, zinc, tin and cerium, because they allow an even higher polishing rate. And among them, iron ion or copper ion is particularly preferred. Further, the metal salt comprising the polyvalent metal ion is one or more from among nitric acid salts, sulfuric acid salts, acetic acid salts and gluconic acid salts of aluminum, nitric acid salts, sulfuric acid salts, acetic acid salts and gluconic acid salts of iron (III), and nitric acid salts, sulfuric acid salts, acetic acid salts and gluconic acid salts of copper (II). And these nitric acid salts of iron (III), and the like are act as an oxidizing agent, too.

The polyvalent metal ion content in the aqueous dispersion is preferably 3–3000 ppm. The content is more preferably 10–2000 ppm, and especially 30–1000 ppm. The polyvalent metal ion has an effect of promoting the function of the oxidizing agent, and when the content of the polyvalent metal ion is less than 3 ppm, the promoting effect will be insufficient and the polishing rate will not be adequately increased. It is also not preferred for the polyvalent metal ion to be added at greater than 3000 ppm because the film targets of semiconductor devices will be contaminated by the metal ion.

The polyvalent metal ion can be produced by adding to the aqueous medium a salt or complex, such as a sulfate or acetate salt, containing a polyvalent metal element, or it may be produced by adding an oxide of a polyvalent metal element. Even a compound that produces a monovalent metal ion when added to the aqueous medium may be used, so long as the ion is converted to a polyvalent metal ion by the oxidizing agent.

The "organic acid" can further improve the polishing rate. As organic acids there may be mentioned paratoluenesulfonic acid, dodecylbenzenesulfonic acid, isoprenesulfonic acid, gluconic acid, lactic acid, citric acid, tartaric acid, malic acid, glycolic acid, malonic acid, formic acid, oxalic acid, succinic acid, fumaric acid, maleic acid and phthalic acid. Among these, gluconic acid, lactic acid, citric acid, tartaric acid, malic acid, glycolic acid, malonic acid, formic acid, oxalic acid, succinic acid, fumaric acid, maleic acid, phthalic acid, quinaldinic acid, quinolinic acid, nicotinic acid and picolinic acid are preferred. Among these, tartaric acid, malic acid, succinic acid, phthalic acid and quinaldinic acid are particularly preferred. These organic acids may be used alone or in combinations of two or more.

As "inorganic acids" there may be mentioned nitric acid, hydrochloric acid and sulfuric acid, and these inorganic acids may also be used alone or in combinations of two or more. Combinations of organic acids and inorganic acids may also be used. These acids can be used at 0.1–10 parts and especially 1–8 parts to 100 parts of the aqueous dispersion. An acid content in the range of 0.1–10 parts is preferred to give an aqueous dispersion with excellent dispersability and sufficient stability, as well as minimal etching and an increased polishing rate.

According to the present invention, a surfactant may be added for more even dispersion of the particles, particularly the polymer particles, in the aqueous dispersion. The surfactant content may be 0.15 wt % or lower, preferably 0.1 wt % or lower, and more preferably 0.05 wt % or lower, with 0.01 wt % or lower being especially preferred. The surfactant is used in the step of production of the aqueous dispersion containing the polymer particles and will remain as an impurity in the polymer particles or the water or aqueous medium, and therefore a lower initial content can give an aqueous dispersion containing polymer particles with more excellent heat resistance, antistatic properties, color fastness, and the like.

Further, the surfactant included in the aqueous dispersion or CMP slurry is not greater than 0.05 part and preferably not greater than 0.03 part, with respect to 100 parts of the polymer particles. It is more preferably not greater than 0.01 part, and especially not greater than 0.025 part. Such an aqueous dispersion or CMP slurry will exhibit even better heat resistance, antistatic properties, color fastness, and the like.

By thus limiting the surfactant content to a small amount, it is possible to maintain the polishing performance while obtaining particles with excellent dispersability, so that faster polishing can be achieved without creating scratches in the polishing surfaces.

The surfactant used may be a cationic surfactant, anionic surfactant or nonionic surfactant. As cationic surfactants there may be mentioned aliphatic amines, aliphatic ammonium salts and the like. As anionic surfactants there may be mentioned carboxylic acid salts such as fatty acid soaps, alkylether carboxylic acid salts and the like; sulfonic acid salts such as alkylbenzenesulfonic acid salts, alkylnaphthalenesulfonic acid salts, α-olefinsulfonic acid salts and the like; sulfonic acid ester salts such as higher alcohol sulfonic acid ester salts, alkylether sulfonic acid salts, sulfonic acid ester salt of polyoxyethylene alkylphenylethers and the like; phosphoric acid ester salts such as alkylphosphoric acid esters, and the like. As nonionic surfactants there may be mentioned ethers such as polyoxyethylene alkyl ethers; ether esters such as polyoxyethylene ethers of glycerin esters; and esters such as polyethyleneglycol fatty acid esters, glycerin esters, sorbitan esters, and the like.

According to the present invention, addition of an alkali metal hydroxide, ammonia, an inorganic alkali salt, an inorganic acid or an organic acid for adjustment of the pH can improve the dispersability and stability of the aqueous dispersion. Ammonia, inorganic alkali salts and inorganic acids are particularly preferred.

As alkali metal hydroxides there may be used sodium hydroxide, potassium hydroxide, rubidium hydroxide, cesium hydroxide and the like. Sodium hydroxide and potassium hydroxide are particularly preferred among these. As inorganic acids there may be used nitric acid, sulfuric acid phosphoric acid or the like, and as organic acids there may be used formic acid, acetic acid, oxalic acid, malonic acid, succinic acid, benzoic acid or the like. Nitric acid and sulfuric acid are commonly used. Adjustment of the pH of the aqueous dispersion can improve the dispersability while also increasing the polishing rate, and the pH is preferably determined as appropriate in consideration of the electrochemical properties of the working surface, the dispersability and stability of the polymer particles and the polishing rate.

The working film subjected to chemical mechanical polishing according to the present invention may be a silicon oxide film, amorphous silicon film, polycrystalline silicon film, single-crystal silicon film, silicon nitride film, pure tungsten film, pure aluminum film or pure copper film, or an alloy film of tungsten, aluminum or copper with another metal, formed on a wafer during manufacture of a semiconductor device such as a VLSI or the like. The working film may also be an oxide or nitride film of a metal such as tantalum or titanium.

When the polishing surface of the working film on the wafer is a metal, the polishing rate can be vastly improved by adding an oxidizing agent to the aqueous dispersion. The oxidizing agent used may be appropriately selected by a Pourbaix diagram, for example, based on the electrochemical properties of the working surface.

The polymer particles contained in the aqueous dispersion used for chemical mechanical polishing of working films on wafers are preferably selected as appropriate depending on the hardness of the working film. For example, in the case of working films made of aluminum or the like having low hardness, it is preferred to use an aqueous dispersion containing polymer particles with a relatively low hardness. On the other hand, in the case of working films of high hardness such as tungsten, it is necessary to use an aqueous dispersion containing polymer particles of relatively high hardness provided by a high degree of crosslinking.

The chemical mechanical polishing of the working film on the wafer using the aqueous dispersion of the present invention can be accomplished with a commercially available chemical mechanical polishing device (such as Model "LGP510" or "LGP552" by Lapmaster SFT Corporation), which has been used in conventional methods employing metal oxide particles as abrasive particles.

After the polishing, it is preferred to remove the residual polymer particles remaining on the polishing surface. The particle removal can be accomplished by a common washing method, and the polishing surface can be heated at high temperature in the presence of oxygen to burn the polymer particles for their removal. As specific methods for burning there may be mentioned exposure to oxygen plasma, or ashing treatment with plasma whereby oxygen radicals are supplied in a downflow; these allow the residual polymer particles to be easily removed from the polishing surface.

A CMP aqueous dispersion of the present invention is used for manufacture of a semiconductor device. Here, "semiconductor device" is used in a wide sense to include polished wafers, various devices provided with or bearing such wafers, and various device provided with plates manufactured from such wafers (i.e., devices on which such plates are mounted).

The ninth through twelfth aspect of the present invention will now be explained in greater detail.

The present inventors have accomplished the present invention by achieving an improvement in the abrasive particles in slurries used for CMP of metal layers.

According to the present invention, a mixture of polymer particles and inorganic particles is used and suitable combinations of polymer particles and inorganic particles are applied depending on the desired polishing effect.

The ninth and tenth aspects of the present invention will now be explained in order. These relate to a method for manufacture of semiconductor devices using slurries with different combinations of polymer particles and inorganic particles.

The CMP slurry used for the ninth aspect of the present invention, relates to a method for manufacture of semiconductor devices, includes aggregates comprising polymer particles and inorganic particles adsorbed onto the polymer particles.

The polymer particles preferably have on their surfaces anionic functional groups with an anionic or nonionic portion, cationic functional groups, amphoteric functional groups or nonionic functional groups.

The inorganic particles used are preferably one or more types selected from the group consisting of alumina, silica, iron oxide red, ceria, carbon and manganese dioxide.

According to the ninth aspect of the present invention, the polymer particles are used in combination with inorganic particles having a different surface potential than the functional groups.

For example, when the polymer particles have anionic functional groups, they may be used in combination with positively charged inorganic particles, such as alumina.

As an alternative example, when the polymer particles have cationic functional groups, they may be used in combination with negatively charged inorganic particles such as silica.

Figure 2:
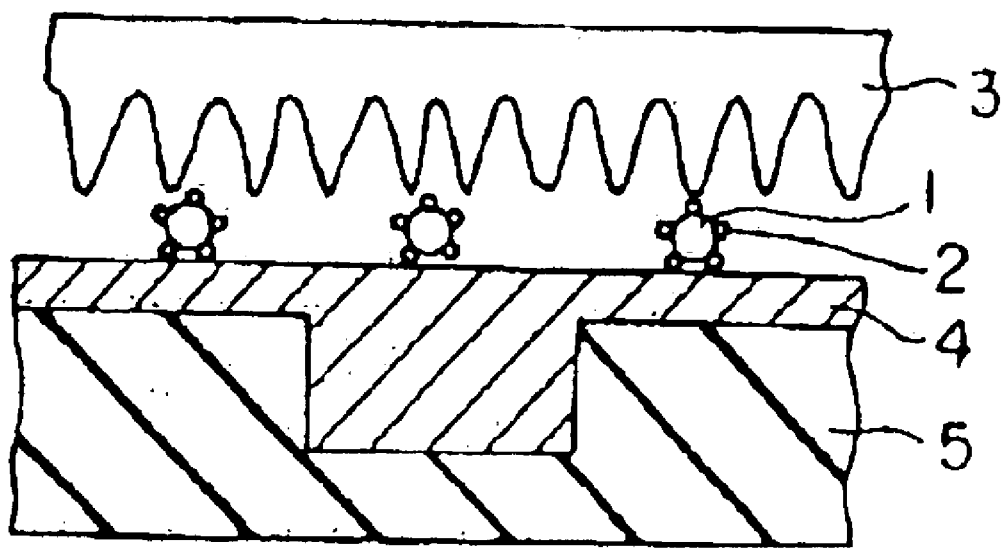
FIG. 2 is a model illustration showing a condition with polymer particles and inorganic particles in a slurry according to the ninth aspect of the invention.

FIG. 2 shows a model illustration of polymer particles and inorganic particles in a slurry according to the ninth aspect of the present invention in a polishing step. In this illustration, 1 is a polymer particle, 2 designates inorganic particles, 3 is a polishing buff, 4 is a metal layer and 5 is an insulating layer. As shown here, aggregates are formed by adsorption of the inorganic particles 2 onto the surface of the polymer particles 1 in the slurry, since the surface potentials of the polymer particles 1 and the inorganic particles 2 are different according to the ninth aspect of the present invention.

With these aggregates, the hard-surface inorganic particles 2 exhibit adequate polishing ability while the high elasticity of the polymer particles 1 prevents scratching and progressive erosion.

The excess polymer particles onto which no alumina particles have adsorbed (particles with no polishing ability) are believed to attach to the alumina layer or infiltrate inbetween the abrasives exhibiting a dummy abrasive effect that prevents over-polishing, thus helping to further control of erosion.

Because of the increased effective particle size of the abrasive particles, their polishing efficiency is increased and satisfactory flattening can be accomplished more efficiently. In addition, while addition of only inorganic particles 2 to the slurry may result in infiltration of the inorganic particles 2 inbetween the buff 3 such that a portion of the inorganic particles 2 used do not contribute to the polishing, the aggregates used according to the ninth aspect of the present invention are of a suitable size that is not easily infiltrated inbetween the buff 3, and therefore they can more efficiently contribute to polishing.

As specific examples of functional groups for the polymer particles there may be mentioned a carboxylic acid type, sulfonic acid type, sulfuric acid ester type, phosphoric acid ester type, amine salt type, quaternary ammonium salt type, ether type, ester type, alkanolamide type, carboxybetaine type and glycine type functional groups.

The polymer particles preferably have a primary particle size of 50–10,000 Å.

The slurry used for the ninth aspect of the present invention employs a combination wherein the inorganic particles are adsorbed by the functional groups of the polymer particles, however even when the polymer particles have no functional groups, a similar phenomenon can be produced by adding a surfactant.

The CMP slurry used for the manufacturing method according to the tenth aspect of the present invention, contains aggregates comprising polymer particles, a surfactant adsorbed onto the polymer particles, and inorganic particles adsorbed onto the polymer particles through the surfactant.

The polymer particles used for the tenth aspect of the present invention are preferably ones without functional groups.

The inorganic particles used for the tenth aspect of the present invention may be selected from among the same inorganic particles that can be used for the ninth aspect of the present invention.

The slurry used for the tenth aspect of the present invention exhibits the same action as a slurry according to the ninth aspect of the present invention, and the slurry contains aggregates wherein inorganic particles are adsorbed onto the surface of the polymer particles through a surfactant, such that the surface exhibits the adequate polishing ability of the hard inorganic particles while the suitable elasticity of the polymer particles prevents the generation of scratches and progressive erosion. The formation of aggregates also increases the effective particle size of the abrasive particles, thus increasing the polishing efficiency and allowing satisfactory flattening to be accomplished more efficiently. In addition, the aggregates are of a suitable size that are not easily infiltrated inbetween the polishing buff, and therefore they can more efficiently contribute to polishing.

The surfactant is preferably selected from among anionic surfactants, anionic surfactants with nonionic portions, cationic surfactants, amphoteric surfactants and nonionic surfactants.

As specific examples of functional groups that are preferably used in the surfactant there may be a mentioned carboxylic acid type, sulfonic acid type, sulfuric acid ester type, phosphoric acid ester type, amine salt type, quaternary ammonium salt type, ether type, ester type, alkanolamide type, carboxybetaine type and glycine type functional groups.

According to the present invention, the metal object to be polished may be, for example, aluminum, copper, tungsten, titanium, niobium, tantalum, silver, vanadium, ruthenium, platinum or an oxygen, nitride, boride or an alloy thereof.

If necessary, an oxidizing agent may be added to the slurry used for the present invention. Addition of an oxidizing agent adds chemical action to the mechanical polishing, thus improving the polishing rate. The oxidizing agent used is preferably an oxidizing agent with a standard electrode potential of −3V to +3V selected from a group consisting of hydrogen peroxide, ammonium peroxydisulfate, phosphoric acid, nitric acid and cerium diammonium nitrate.

The eleventh and twelfth aspects of the present invention correspond to the semiconductor manufacturing methods according to the ninth aspect and tenth aspect of the present invention, respectively.

The method for formation of embedded wiring, according to the eleventh aspect of the present invention, comprises a step of polishing a working film using a slurry according to the ninth aspect of the present invention.

The method for formation of embedded wiring according to the twelfth aspect of the present invention comprises a step of polishing a working film using a slurry according to the tenth aspect of the present invention.

EMBODIMENTS OF THE INVENTION

The present invention will now be explained in greater detail by way of the following examples.

(1) Synthesis of Polymer Particles

SYNTHESIS EXAMPLE 1

Synthesis of Polymer Particles (a)

After loading 92 parts of styrene, 4 parts of methacrylic acid, 4 parts of hydroxyethyl acrylate, 0.1 part of ammonium lauryl sulfate, 0.5 part of ammonium persulfate and 400 parts of ion-exchanged water in a 2-liter volume flask, the contents were heated to 70° C. while stirring under a nitrogen gas atmosphere, for 6 hours of polymerization. This yielded a water dispersion containing carboxy-modified polystyrene particles [polymer particles (a)] with a mean particle size of 0.24 μm, having carboxyl groups, hydroxyl groups and ester groups. The polymerization yield was 95%, and the carboxyl group distribution as measured by conductometric titration was 40% inside the particles, 50% on the particle surfaces and 10% in the aqueous phase.

SYNTHESIS EXAMPLE 2

Synthesis of Polymer Particles (b)

After loading 94.5 parts of methyl methacrylate, 4 parts of methacrylic acid, 1 part of divinylbenzene (55% purity), 0.5 part of methacrylamide, 0.03 part of ammonium lauryl sulfate, 0.6 part of ammonium persulfate and 400 parts of ion-exchanged water in a 2-liter volume flask, the contents were heated to 70° C. while stirring under a nitrogen gas atmosphere, for 6 hours of polymerization. This yielded crosslinked polymethyl methacrylate-based particles [polymer particles (b)] with a mean particle size of 0.17 μm, having carboxyl groups, amide groups and ester groups. The polymerization yield was 95%, and the carboxyl group distribution as measured by conductometric titration was 15% inside the particles, 70% on the particle surfaces and 15% in the aqueous phase.

SYNTHESIS EXAMPLE 3

Synthesis of Polymer Particles (c)

After loading 94 parts of methyl methacrylate, 4 parts of methacrylic acid, 2 parts of hydroxymethyl methacrylate, 0.03 part of ammonium lauryl sulfate, 0.6 part of ammonium persulfate and 400 parts of ion-exchanged water in a 2-liter volume flask, the contents were heated to 70° C. while stirring under a nitrogen gas atmosphere, for 6 hours of polymerization. This yielded polymethyl methacrylate-based particles [polymer particles (c)] with a mean particle size of 0.17 μm, having carboxyl groups, hydroxyl groups and ester groups. The polymerization yield was 95%, and the carboxyl group distribution as measured by conductometric titration was 15% inside the particles, 70% on the particle surfaces and 15% in the aqueous phase.

SYNTHESIS EXAMPLE 4

Synthesis of Polymer Particles (d)

After loading 90 parts of methyl methacrylate, 5 parts of methoxypolyethyleneglycol methacrylate (trade name: "NK Ester M-90G", #400, product of Shinnakamura Chemical Industries Co., Ltd.), 5 parts of 4-vinylpyridine, 2 parts of an azo-based polymerization initiator (trade name "V50" product of Wako Junyaku Co., Ltd.) and 400 parts of ion-exchanged water in a 2-liter volume flask, the contents were heated to 70° C. while stirring under a nitrogen gas atmosphere, for 6 hours of polymerization. This yielded polymethyl methacrylate-based particles [polymer particles (d)] with a mean particle size of 0.19 μm, having amino groups and pyridyl groups (or their cations), as well as polyethylene glycol chain-bearing functional groups (ether groups) and ester groups. The polymerization yield was 95%.

The polymer particles (a)–(d) obtained in this manner were added at 0.1 part to 100 parts of a 0.1 N potassium chloride aqueous solution and dispersed therein, the pH of each water dispersion was adjusted to 2.1, 5.5 and 12 with hydrochloric acid or potassium hydroxide, and the zeta potential at each pH was measured with a zeta potential meter (trade name: "Zeta Plus" by BROOKHAVEN INSTRUMENTS CORPORATION) using the laser doppler method. The inorganic particles used in each of the examples described below were then added at 0.1 part to 100 parts of a 0.1 N potassium chloride aqueous solution and dispersed therein, and the zeta potential of each was measured in the same manner. The results are listed in Table 1, and shown in FIG. 1.

(2) Preparation of Aqueous Dispersion (CMP Slurry)

EXAMPLE 1A

Preparation of Aqueous Dispersion Containing Polymer Particles (a) and Alumina Particles After adding the polymer particles (a) synthesized in Synthesis Example 1, fumed alumina particles (trade name: "Aluminium Oxide C" by Degusa Corporation, mean particle size:0.13μm), hydrogen peroxide and ammonium lactate to ion-exchanged water at respective concentrations of 0.5 wt % (hereunder, "%"), 5%, 4% and 1%, the pH was adjusted to 6 with potassium hydroxide to obtain an aqueous dispersion (CMP slurry). The zeta potential of the polymer particles (a) at pH 6 was about −32 mV as read off from the graph in FIG. 1 representing the correlation between pH and zeta potential, and the zeta potential of the alumina particles was about +30 mV. Observation with a transmission electron microscope and examination of a photograph taken thereof revealed that the polymer particles (a) and the alumina particles had aggregated to a mean particle size of 1–5 μm.

EXAMPLE 2A

Preparation of Aqueous Dispersion Containing Polymer Particles (b) and Alumina Particles After adding the polymer particles (b) and fumed alumina particles (trade name: "Aluminium Oxide C" by Degusa Corporation, mean particle size:0.13 μm) to ion-exchanged water at respective concentrations of

TABLE 1

|  |  | Polymer particles | | | | Inorganic particles | | |
| --- | --- | --- | --- | --- | --- | --- | --- | --- |
|  |  | (a) | (b) | (c) | (d) | Alumina | Titania | Silica |
| pH | 2.1 | −11.1 | −23.7 | −21.9 | 12.5 | 35 | 21 | 2 |
|  | 5.5 | −31.5 | −24.6 | −34.0 | 10.6 | 34 | 4 | −30 |
|  | 12 | −40.7 | −35.9 | −34.4 | −10.8 | −25 | −40 | −55 |

0.7% and 5%, the pH was adjusted to 4 with nitric acid to obtain an aqueous dispersion (CMP slurry). The zeta potential of the polymer particles (b) at pH 4 was about −24 mV as read off from the graph in FIG. 1 representing the correlation between pH and zeta potential, and the zeta potential of the alumina particles was about +35 mV. Observation with a transmission electron microscope and examination of a photograph taken thereof revealed that the polymer particles (b) and the alumina particles had aggregated to a mean particle size of 2–10 μm.

EXAMPLE 3A

Preparation of Aqueous Dispersion Containing Polymer Particles (c) and Titania Particles After adding the polymer particles (c), fumed titania particles (product no.: "P25" by Nihon Aerosil Corporation, mean particle size:0.25μm), iron nitrate and malonic acid to ion-exchanged water at respective concentrations of 0.3%, 3%, 0.1% and 1%, the pH was adjusted to 2 with nitric acid to obtain an aqueous dispersion (CMP slurry). The zeta potential of the polymer particles (c) at pH 2 was about −22 mV as read off from the graph in FIG. 1 representing the correlation between pH and zeta potential, and the zeta potential of the titania particles was about +21 mV. Observation with a transmission electron microscope and examination of a photograph taken thereof revealed that the polymer particles (c) and the titania particles had aggregated to a mean particle size of 0.5–3 μm.

EXAMPLE 4A

Preparation of Aqueous Dispersion Containing Polymer Particles (d) and Silica Particles After adding the polymer particles (d), fumed silica particles (product no.: "#90" by Nihon Aerosil Corporation), hydrogen peroxide and ammonium lactate to ion-exchanged water at respective concentrations of 0.5%, 5%. 4% and 1%, the pH was adjusted to 7.2 with potassium hydroxide to obtain an aqueous dispersion (CMP slurry). The zeta potential of the polymer particles (d) at pH 7.2 was about +6 mV as read off from the graph in FIG. 1 representing the correlation between pH and zeta potential, and the zeta potential of the silica particles was about −36 mV. Observation with a transmission electron microscope and examination of a photograph taken thereof revealed that the polymer particles (d) and the silica particles had aggregated to a mean particle size of 1–10 μm.

EXAMPLE 5A

Preparation Example with Application of Shear Stress to Aqueous Dispersion

The aqueous dispersion obtained in Example 1A was further dispersed by ultrasonic wave treatment to obtain a stable aqueous dispersion (CMP slurry). Observation with a transmission electron microscope and examination of a photograph taken thereof revealed that the aggregates with a mean particle size of 1–5 μm had been refined to a mean particle size of 0.5 μm, and confirmed that numerous alumina particles had uniformly attached to the polymer particles (a).

EXAMPLE 6A

Preparation Example with Application of Shear Stress to Aqueous Dispersion

The aqueous dispersion obtained in Example 4A was further dispersed by a pressure of 700 kg/cm² using a high-pressure homogenizer (Model "PR01-30" by Genus Corporation) to obtain a stable aqueous dispersion (CMP slurry). Observation with a transmission electron microscope and examination of a photograph taken thereof revealed that the aggregates with a mean particle size of 1–10 μm had been refined to a mean particle size of 0.6 μm, and confirmed that numerous silica particles had uniformly attached to the polymer particles (d).

COMPARATIVE EXAMPLE 1A

Preparation of Aqueous Dispersion Containing no Polymer Particles

An aqueous dispersion (CMP slurry) was prepared in the same manner as Example 1A, except that the polymer particles (a) were not included.

(3) Magnetic Disk Polishing Test

EXAMPLE 1B

The aqueous dispersions obtained in Examples 1A, 2A and Comparative Example 1A were diluted with water until the aggregate (composite particle) concentration reached 5%, and then aluminum nitrate was added to each dilution as a polishing accelerator to a 1% concentration to obtain polishing materials. For comparison, polishing materials were also prepared with the same composition but containing 5% of colloidal silica (trade name: "Snowtex 20", product of Nissan Chemical Industries Co., Ltd., mean particle size: 0.014 μm) or fumed silica (trade name: "Aerosil #90", product of Nihon Aerosil Co., Ltd., mean particle size: 0.19 μm).

These polishing materials were used for polishing of a magnetic disk plate under the following conditions, and the polishing rates and condition of polishing scratches were evaluated.

<Polishing Conditions>

Plate: Ni—P electroless plated 3.5-inch aluminum disk (already subjected to one step of polishing)

Polishing apparatus: Model "LM-15C" by Lapmaster SFT Corporation

Polishing pad: Trade name: "Polydex DG", by Rodel Corporation (U. S.)

Working load: 70 g/cm²

Plate rotation speed: 50 rpm

Polishing material supply rate: 15 ml/min.

Polishing time: 10 minutes

<Evaluation Method>

Polishing rate: The polishing rate was determined by the following equation, based on the weight reduction of the disk by polishing.

$$\text{Polishing rate } (\text{Å/min}) = [(W/d)/S] \times 10^8$$

W=disk weight reduction per minute due to polishing d=Ni—P electroless plating density S=polishing surface area Polishing scratches: After washing and drying the polished disk, it was placed under a spotlight in a dark room and the presence of scratches was visually observed.

As seen by the results of this polishing test, when the CMP slurries of Examples 1A and 2A were used for polishing of magnetic disks, the polishing rates were high at 4800 Å/min and 6900 Å/min, respectively, and no polishing scratches were produced. However, in Comparative Example 1A and when colloidal silica or fumed silica was used, the polishing rate was lower at 800–1900 Å/min, and numerous polishing scratches were observed. This demonstrates that both of the CMP slurries (Example 1A and 2A) have excellent polishing performance for magnetic disk plates.

(4) CMP Test

EXAMPLE 1C

Polishing Test on Copper Film Using CMP Slurry Containing Polymer Particles (a) and Alumina Particles Using the CMP slurry obtained in Example 1A, a copper film on an 8-inch thermal oxidation film-coated silicon wafer (film thickness: 15,000 Å) set in a CMP apparatus (Model "LPG510", by Lapmaster SFT Corporation) was polished for one minute with a porous polyurethane polishing pad (Product No. "IC1000" by Rodel Nitta Corporation) at a load of 300 g/cm². The thickness of the polished copper film was measured with an electric conductive film thickness meter, and calculation of the polishing rate gave a value of 5900 Å/min. When a silica film formed on a silicon substrate was polished under the same conditions, washed and dried, no more than 30 scratches were found on the polishing surface as confirmed with a KLA (Model "Surfscan SP-1", product of KLA Tencor Corporation).

EXAMPLE 2C

Polishing Test on Aluminum Film Using CMP Slurry Containing Polymer Particles (b) and Alumina Particles Using the CMP slurry obtained in Example 2A, an aluminum film on an 8-inch thermal oxidation film-coated silicon wafer (film thickness: 5000 Å, containing 1% copper) was polished in the same manner as Example 1C. The polishing rate was then calculated in the same manner as Example 1C, and the presence of any scratches was confirmed. As a result, the polishing rate was 3900 Å/min, and no more than 30 scratches were found on the polishing surface.

EXAMPLE 3C

Polishing Test on Tungsten Film Using CMP Slurry Containing Polymer Particles (c) and Titania Particles Using the CMP slurry obtained in Example 3A, a tungsten film on an 8-inch thermal oxidation film-coated silicon wafer (film thickness: 5000 Å) was polished in the same manner as Example 1C. The polishing rate was then calculated in the same manner as Example 1C, and the presence of any scratches was confirmed. As a result, the polishing rate was 3300 Å/min, and no more than 30 scratches were found on the polishing surface.

EXAMPLE 4C

Polishing Test on Copper Film Using CMP Slurry Containing Polymer Particles (d) and Silica Particles The CMP slurry obtained in Example 4A was used for polishing of a copper film in the same manner as Example 1C. The polishing rate as calculated in the same manner as Example 1C was 5400 Å/min.

EXAMPLE 5C

Polishing Test on Tungsten Film Using CMP Slurry Containing Polymer Particles (d) and Silica Particles 0.214 parts by weight of copper gluconate (to be contained 300 ppm in terms of copper ions), 2 parts by weight of hydrogen peroxide, 1 parts by weight of succinic acid and 5 parts by weight of composite particles where numerous silica particles uniformly attached to the polymer particles obtained in Example 6A as solid content were mixed in ion-exchanged water to prepare 100 parts by weight of CMP slurry.

When the working film containing a tungsten layer of semiconductor device was soaked CMP slurry for 30 minutes, the etching depth of the tungsten layer was 400 Å. And a tungsten film on an 6-inch thermal oxidation film-coated silicon wafer (film thickness: 3,000 Å)set in a chemical mechanical polishing apparatus (Model "LPG-510", by Lapmaster SFT Corporation) was polished with a porous polyurethane polishing pad (Trade name "IC1000" by Rodel Nitta Corporation) at a load of 300 g/Cm². Providing a CMP slurry to a surface of a urethane pad at a rate of 150 ml/min, polishing with a rotation speed of 50 rpm for one minute was carried out. As a result, the polishing rate was 1500 Å/min. Observation with a scanning electron microscope revealed that a surface of a tungsten film was not corroded at all.

EXAMPLE 6C

Polishing Test on Copper Film Using Ultrasonic-treated CMP Slurry

The CMP slurry obtained in Example 5A was used for polishing of a copper film in the same manner as Example 1C, and upon calculation of the polishing rate and confirmation of any scratches in the same manner as Example IC. The polishing rate was 5200 Å/min, and no more than 30 scratches were found on the polishing surface.

EXAMPLE 7C

Polishing Test on Copper Film Using High-pressure Homogenized CMP Slurry

The CMP slurry obtained in Example 6A was used for polishing of a copper film in the same manner as Example 1C, and upon calculation of the polishing rate in the same manner as Example 1C. The polishing rate was 4800 Å/min, and no more than 30 scratches were found on the polishing surface.

COMPARATIVE EXAMPLE 1C

Preparation of Aqueous Dispersion Containing no Polymer Particles, and Copper Film Polishing Test Using it A CMP slurry was prepared in the same manner as Example 1C except that the polymer particles (a) were not included. This CMP slurry was used for polishing of a copper film with the same apparatus and procedure as in Example 1C, and upon calculation of the polishing rate and confirmation of any scratches in the same manner as Example 1C. The polishing rate was low at 1900 Å/min, and numerous scratches were observed.

EFFECT OF EXAMPLES 1C–7C

The CMP slurry employing no polymer particles (Comparative Example 1C) had a low polishing rate and resulted in observation of numerous scratches.

However, upon CMP polishing of a copper film on a silicon wafer (Examples 1C, 4C), an aluminum film on a silicon wafer (Example 2C) and a tungsten film on a silicon wafer (Example 3C) among Examples 1C–7C by using CMP aqueous dispersions (CMP slurries) according to the present invention, all exhibited excellent results with high polishing rates and no more than 30 scratches. A similarly excellent polishing effect was exhibited even with ultrasonic wave treatment (Example 6C) or high-pressure homogenizer treatment (Example 7C). These CMP slurries were therefore demonstrated to exhibit excellent polishing performance.

(5) CMP Tests on Low Dielectric Insulating Films

EXAMPLE 1D (1) Synthesis of Low Dielectric Insulating Material

After loading 170.7 g of methyl trimethoxysilane, 42.7 g of tetramethoxysilane, 1.0 g of diisopropoxytitanium bis-ethylacetylacetate and 417 g of propyleneglycol monopropylether in a separable flask and stirring the mixture, it was heated to 60° C. A mixed solution of 176 g of ion-exchanged water and 206 g of propyleneglycol monopropylether was then added thereto over a period of 2 hours while maintaining a temperature of 60° C., and reaction was conducted for 8 hours at 6020 C. Acetylacetone was added at 51 g, and 500 g of the solvent containing methanol was removed at 40° C. under reduced pressure to obtain an aqueous solution containing a low permittivity insulating material.

(2) Fabrication of Coating Containing Low Permittivity Insulating Material and Film Comprising Low Permittivity Insulating Material The aqueous solution obtained in (1) above was applied onto an 8-inch silicon wafer surface with a spin coater. The coating was carried out for 31 seconds with a rotation speed of 2500 rpm. The aqueous solution-coated wafer was then heated for 5 minutes on a hot plate heated to 80° C. to remove the organic solvent. The wafer was then further heated for 5 minutes on a hot plate heated to 200° C., after which it was further heated for 60 minutes in an oven with a nitrogen atmosphere that had been heated to 450° C., to harden the coating on the wafer surface to form a film.

(3) Evaluation of Film Permittivity

Aluminum was vapor-deposited onto the film obtained in (2) above, and measurement of the permittivity at a frequency of 1 MHz gave a low value of 2.65. The permittivity was measured using an HP16451B electrode and HP4284A Precision LCR meter by Yokokawa-Hewlett Packard Corporation.

(4) CMP Test on Low Permittivity Insulating Film

The CMP slurry obtained in Example 2A was used for polishing in the same manner as Example 1C on a low permittivity insulating material film formed in the same manner as (2) above. The thickness of the insulating film was measured using a Model "FTP500-5" Interference Film Thickness Probe by SENTEC CORPORATION, and the polishing rate was calculated. As a result, the polishing rate was low at 45 Å/min, which was a satisfactory result since a lower polishing rate is preferred for the insulating film. The number of scratches was measured in the same manner as Example 1C, and found to be no more than 30.

EXAMPLE 2D

CMP Test on Low Permittivity Insulating Film

Polishing was carried out in the same manner as Example 1D using the CMP slurry obtained in Example 3A, except that the product "FLARE" (permittivity: approximately 2.7) by Allied Signal Corporation was used instead of the film formed in the manner of (2) above as the low permittivity insulating film. The polishing rate was calculated and the presence of any scratches was confirmed, in the same manner as Example 1D. As a result, the polishing rate was 40 Å/min, and the number of scratches on the polished surface was no more than 30.

EXAMPLE 3D

CMP Test on Low Permittivity Insulating Film

Polishing was carried out in the same manner as Example 2D, except that the product "BCB" (permittivity: approximately 2.7) by Dow Chemical Corporation was used instead of the product "FLARE" by Allied Signal Corporation. The polishing rate was calculated and the presence of any scratches was confirmed, in the same manner as Example 2D. As a result, the polishing rate was 48 Å/min, and the number of scratches on the polished surface was no more than 30.

EFFECT OF TEST EXAMPLES 1D–3D

When metal films combined with low permittivity insulating films are used as wafer working films for polishing, the polishing rate must be low so as not to result in overpolishing, since low strength, low permittivity insulating films are to be provided. When the CMP slurries of the examples (Examples 1D–3D) were used, the polishing rates were sufficiently low as required, and the numbers of scratches on the polished surfaces were also at a satisfactory level of no more than 30.

(6) Formation of Embedded Wiring

Figure 3:
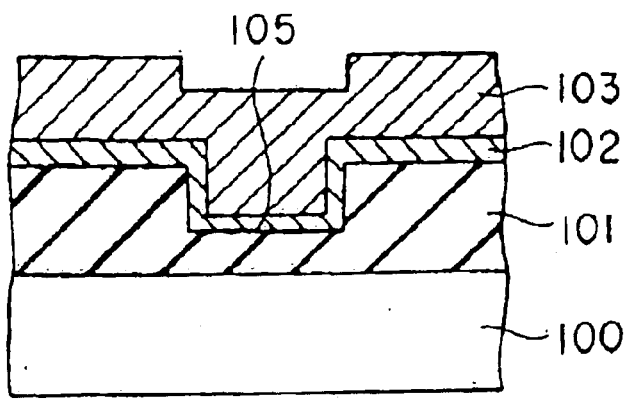
FIG. 3 is an illustration showing an example of a step in formation of aluminum damascene wiring.
Figure 4:
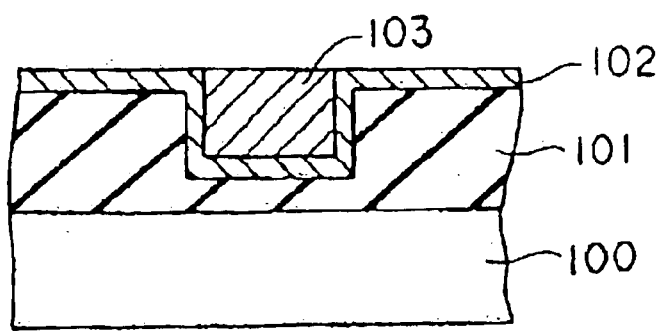
FIG. 4 is an illustration showing an example of a step in formation of aluminum damascene wiring.
Figure 5:
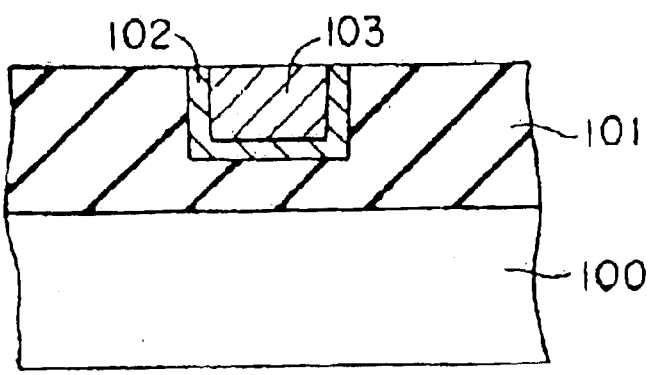
FIG. 5 is an illustration showing an example of a step in formation of aluminum damascene wiring.

FIG. 3 through FIG. 5 show examples of a method for formation of aluminum damascene wiring.

First, as shown in FIG. 3, an insulating film 101 with a patterned 4000Å depth trench 105 is formed on a substrate 100 on which a semiconductor element is disposed (not shown), and then a niobium liner 102 is deposited to 300 Å and an aluminum film 103 is deposited to 6000 Å.

Next, the Al film 103 and the Nb liner 102 on the field are removed by CMP.

Thereafter, two-step polishing is performed, with polishing to remove the Al film 103 as shown in FIG. 4, and a second step of polishing to remove the Nb liner 102, as shown in FIG. 5.

Embodiment 1E

Polymer particles with anionic functional groups and positively charged inorganic particles were used for the polishing slurry. The composition was as follows.

| Polishing slurry | |
| --- | --- |
| Polymethylmethacrylate (primary particle size: 2000 Å) (functional group: carboxyl) | 0.5 parts by weight |
| Alumina particles (primary particle size: 200 Å) (zeta potential: +35 mV at pH 2) | 3.0 parts by weight |
| Water | Remainder |
| pH 7 | |

This slurry was used for first polishing under conditions with a load of 300 g/cm$^2$, a top ring rotation speed of 60 rpm and a table rotation speed of 100 rpm, which gave an Al polishing rate of 2000 Å/min.

For comparison, slurries were prepared including only the polymethylmethacrylate or only alumina particles as the abrasive particles, for measurement of the aluminum polishing rate under the same conditions. The results are shown in FIG. 6.

Figure 6:
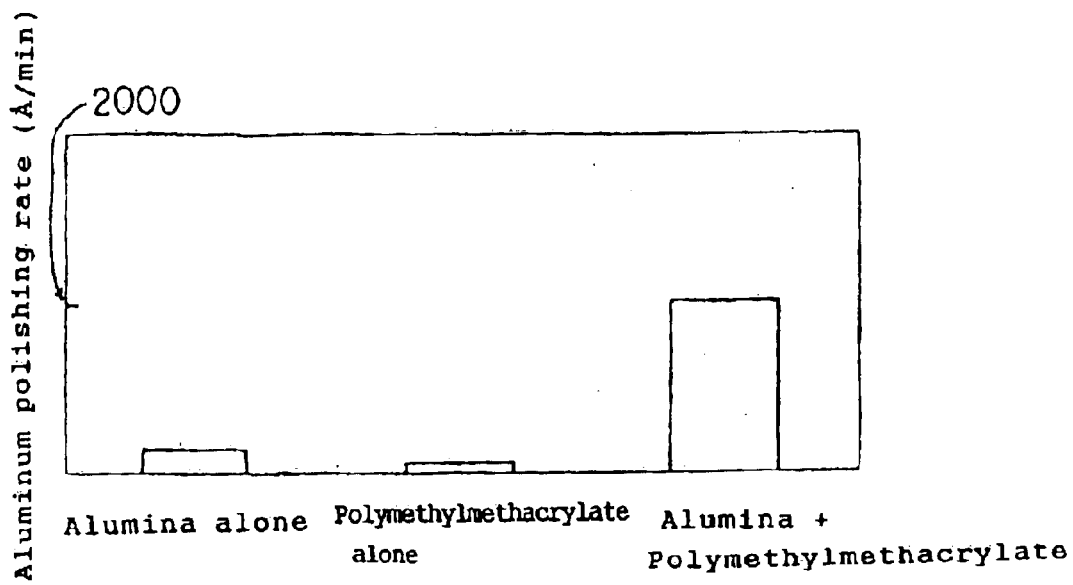
FIG. 6 is a graph showing the polishing rate obtained with an example of a slurry according to the ninth aspect of the invention.

As seen in FIG. 6, almost no polishing ability was exhibited with the polymer particles or the alumina alone, but a drastic increase in polishing ability was confirmed when both were included.

Figure 7:
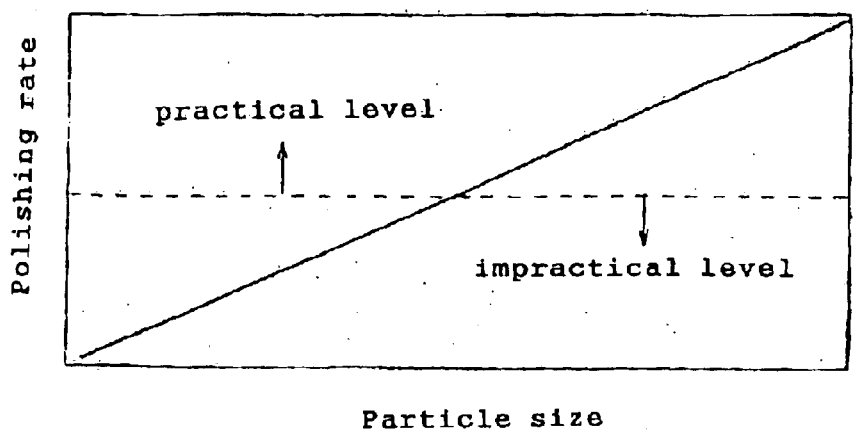
FIG. 7 is a graph showing the relationship between the alumina particle size and polishing rate.
Figure 8:
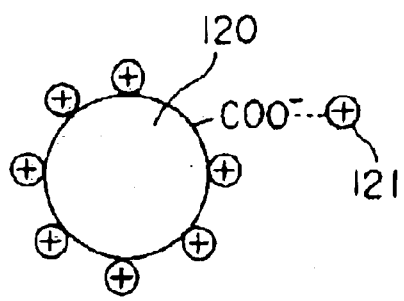
FIG. 8 is a model illustration of an example of an aggregate in a slurry according to the ninth aspect of the invention.

FIG. 7 is a graph showing the relationship between the particle size of the alumina particles and the polishing rate when polishing was carried out using the slurry containing these particles alone. As shown in this graph, the polishing rate tends to increase with a larger particle size of the alumina particles in the slurry. However, it is thought that since the polymer particles used in the slurry of the present invention have a negative charge in the slurry whereby the alumina particles that have a zero or positive charge are adsorbed thereonto, the effective particle size is thus increased, thereby improving the polishing rate as with the alumina particles. FIG. 8 shows a model illustration of a resulting aggregate. Here, 120 represents a polymethylmethacrylate particle and 121 represents alumina particles.

When large-sized alumina is used alone there is a trade-off relationship with the degree of scratching, and therefore it is unfortunately not of a practical level.

On the other hand, with polymer particles there is virtually no particle size dependence for scratching and the polishing rate. Yet, combination with inorganic particles gives a particle size that is favorable from the viewpoint of reduced scratching and slurry dispersability (stability), for reasons explained below.

Figure 9:
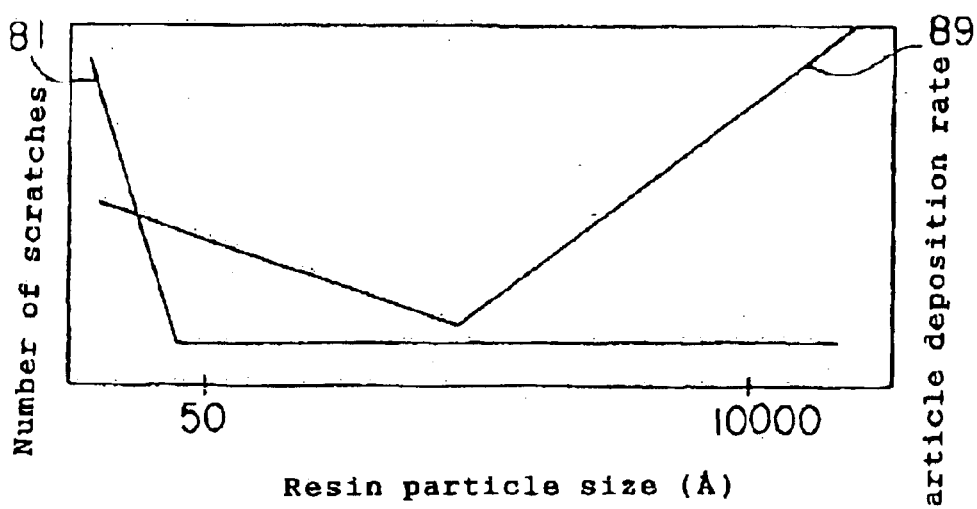
FIG. 9 is a graph showing the number of scratches generated.

FIG. 9 is a graph showing the relationship between the particle size of the polymethylmethacrylate and the incidence of scratching when polishing is carried out using a slurry including inorganic particles, as well as the relationship between the particle size and the deposition rate of the particles in the slurry.

As shown by graph line 81, the cushion effect is weakened when the polymer particle size is under 50 Å, so that it is not possible to avoid scratches due to the inorganic particles. However, as shown by the graph line 89, a polymer particle size of greater than 10,000 Å A results in considerable generation of homoaggregation which tends to cause deposition, thus impairing the dispersability of the slurry. Consequently, the practical polymer particle size when mixed with inorganic particles is 50–10,000 Å.

With this slurry, the cushioning effect of the polymer particles prevented scratches even when polishing with a relatively hard pad.

Figure 10:
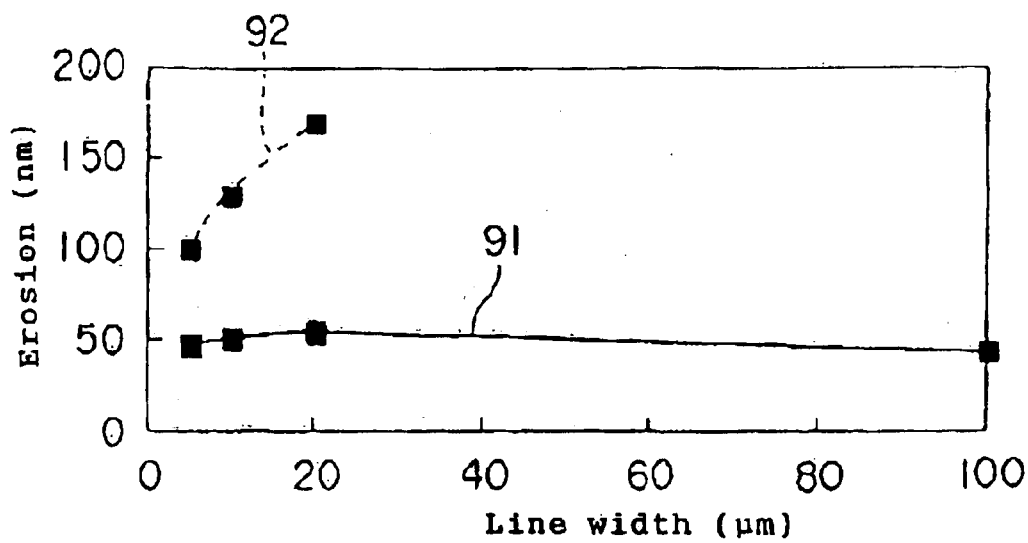
FIG. 10 is a graph showing the depth of erosion.

FIG. 10 is a graph showing the results of measuring the depth of erosion produced when polishing working objects of different line widths, using the above-mentioned slurry (graph line 91) and a slurry employing alumina particles and an oxidizing agent (graph line 92).

As shown in this graph, when the slurry of the present invention was used there was virtually no progressive erosion even with increased line width.

Embodiment 2E

Polymer particles with cationic functional groups and negatively charged inorganic particles were used for the polishing slurry. The

| Polishing slurry | |
| --- | --- |
| Polystyrene (primary particle size: 2000 Å) (functional group: amino) | 0.5 parts by weight |
| Silica particles (primary particle size: 200 Å) | 3.0 parts by weight |
| Water | Remainder |
| pH 7 | |

Figure 11:
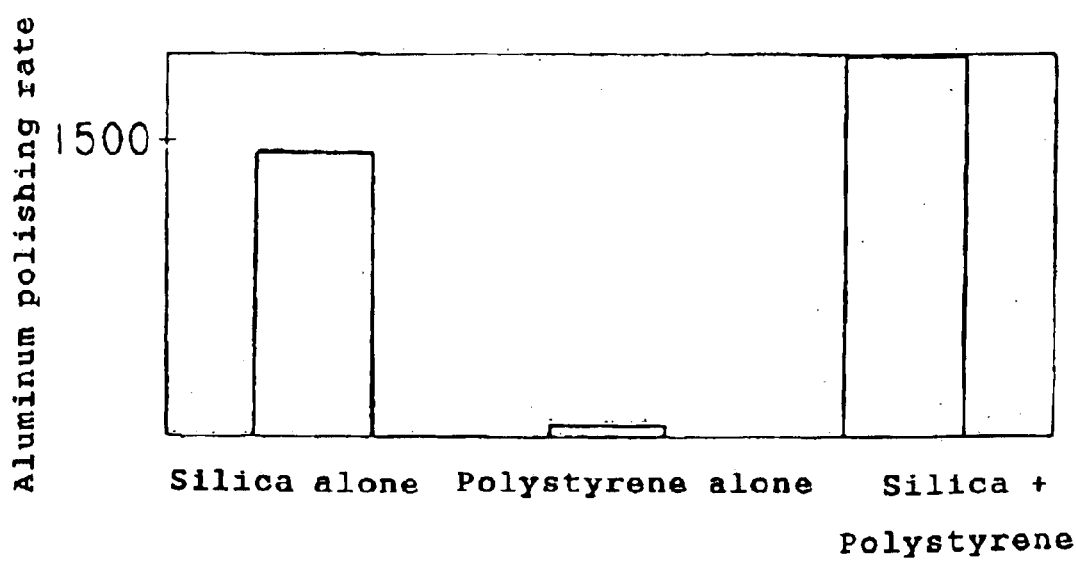
FIG. 11 is a graph showing the polishing rate obtained with another example of a slurry according to the ninth aspect of the invention.

Polishing was performed in the same manner as Embodiment 1E except for using the above slurry, and the polishing rate thereof was measured. For comparison, the same measurement was conducted for slurries using only the silica particles or only the polystyrene particles. The results are shown in FIG. 11.

As seen in the graph, even the slurry using silica particles alone gave a high polishing rate of about 1500 Å/min, while with the slurry according to the tenth aspect of the present invention it was possible to achieve an even higher polishing rate of 3500 Å/min.

Figure 12:
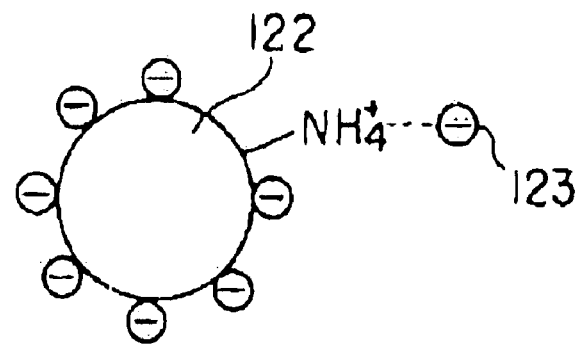
FIG. 12 is a model illustration of another aggregate in a slurry according to the ninth aspect of the invention.

This suggests that, as in Embodiment 1E, aggregates had formed by adsorption of the negatively charged silica particles on the surface of the polystyrene particles that were positively charged due to the presence of the amino groups in the slurry, thus increasing the effective particle size of the silica. A model illustration of such an aggregate is shown in FIG. 12. Here, 122 is a polystyrene particle, and 123 represents silica particles.

As in Embodiment 1E, the cushioning effect of the polymer particles prevented the generation of scratches even when polishing with a relatively hard pad. A preventive effect on progressive erosion was also exhibited, as in Embodiment 1E.

Embodiments 1E and 2E illustrate combinations of polymer particles with anionic or cationic functional groups with alumina particles or silica particles; however, the same effect can be achieved with a combination wherein the anionic or cationic organic functional group having nonionic portion, and the inorganic particles have a complementary surface charge, as with alumina, silica or iron oxide red, for example.

Embodiment 3E

Polymer particles with no functional groups, an anionic surfactant and non-charged or positively charged inorganic particles were used for the polishing slurry. The composition was as follows.

| Polishing slurry | |
| --- | --- |
| Polystyrene (primary particle size: 2000 Å) | 0.5 parts by weight |
| Alumina particles (primary particle size: 200 Å) | 3.0 parts by weight |
| Sodium dodecyl sulfate | 0.05 parts by weight |
| Water | Remainder |
| pH 7 | |

Polishing was performed in the same manner as Embodiment 1E except that the above slurry was used.

Figure 13:
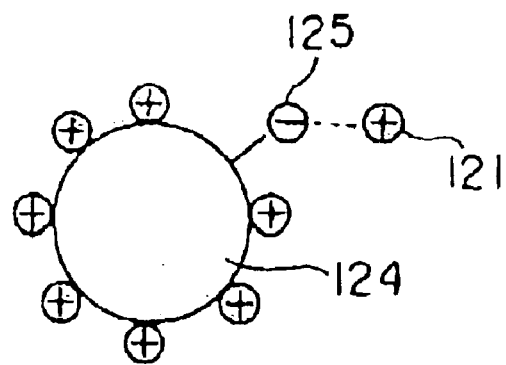
FIG. 13 is a model illustration of an aggregate in a slurry according to the tenth aspect of the invention.

FIG. 13 shows a model illustration of an aggregate in the slurry.

In this slurry, the lipophilic portions of the surfactant 125 is adsorbed onto the surface of the polystyrene particles 124 thus negatively charging the polystyrene particles 124. Also, the uncharged or positively charged alumina particles 121 adsorbed onto the hydrophilic portions of the surfactant 125, thus resulting in adsorption between the polystyrene particles 124 and the alumina particles 121 by way of the surfactant 125.

As a result, due to aggregation between the polystyrene particles 124 with no functional groups and the alumina particles 121, the same effect is achieved as with the slurry of Embodiment 1E.

Embodiment 4E

The polishing slurry used included polymer particles with cationic functional groups and inorganic particles with a negative charge. The composition was as follows.

| Polishing slurry | |
| --- | --- |
| Polystyrene (primary particle size: 2000 Å) (functional group: amino) | 0.5 parts by weight |
| Silica particles (primary particle size: 200 Å) | 3.0 parts by weight |
| Hydrogen peroxide (oxidizing agent) | 1.0 part by weight |
| Water | Remainder |
| pH 5 | |

Polishing was performed in the same manner as Embodiment 1E except that the above slurry was used.

Because this slurry contained an oxidizing agent, it exhibited chemical action during polishing unlike a slurry containing no oxidizing agent, and therefore the polishing rate was improved by the interaction.

These embodiments 1E–4E are not intended to be restrictive, and the load, the top ring and turntable rotation speed, and the like, during the polishing may be varied as appropriate.

The pH range used for the present invention is preferably from pH 3 through 12, and for formation of Al damascene wiring it is more preferably about pH 7.

What is claimed is:

1. A dispersion comprising polymer particles, inorganic particles and water, wherein the zeta potential of said polymer particles and the zeta potential of said inorganic particles are of opposite signs, and said polymer particles and said inorganic particles are electrostatically bonded to form composite particles,
    wherein said polymer particles have at least one functional group selected from the group consisting of a carboxyl group, an anion of a carboxyl groups, a sulfonic acid group and an anion of a sulfonic acid group, and said inorganic particles arc alumina, titania, or combinations thereof, and
    wherein a plurality of said inorganic particles are attached to a surface of each of said polymer particles, and a ratio (Sp/Si) of a mean particle size of said polymer particles (Sp) and a mean particle size of said inorganic particles (Si) is from 1 to 40, and
    the mean particle size of the composite particles is 0.1 to 1.0 μm.

2. The dispersion according to claim 1, wherein said inorganic particles are alumina, and the pH of said aqueous dispersion is from 2 to 9.

3. The dispersion according to claim 1, wherein said inorganic particles are titania, and the pH of said aqueous dispersion is from 2 to 6.

4. The dispersion according to claim 1, wherein said polymer particles have at least one further functional group selected from the group consisting of an ester group, an amide group, a hydroxyl group and an ether group.

5. The dispersion according to claim 1, wherein a ratio (Sp/Si) of a mean particle size of said polymer particles (Sp) and a mean particle size of said inorganic particles (Si) is from 1.5 to 20.

6. The dispersion according to claim 1, wherein a ratio (Wp/Wi) of a content of said polymer particles (Wp) and a content of said inorganic particles (Wi) is from 0.05 to 1.

7. The dispersion according to claim 1, further comprising a surfactant, wherein a content of said surfacant is not greater than 0.15 wt %.

8. The dispersion according to claim 7, further comprising an oxidizing agent, a polyvalent metal ion, or a combination thereof.

9. The dispersion according to claim 8, further comprising an organic acid.

10. The dispersion according to claim 1, wherein the mean particle size of the polymer particles and the inorganic particles is 0.01 to 1.0 μm.

11. A dispersion comprising polymer particles, inorganic particles and water, wherein the zeta potential of said polymer particles and the zeta potential of said inorganic particles are of opposite signs, and said polymer particles and said inorganic particles are electrostatically bonded to form composite particles,
    wherein said polymer particles have at least one functional group selected from the group consisting of a cation-formable nitrogen-containing group and a cation of a cation-formable nitrogen-containing group, and at least one of said inorganic particles is selected from the group consisting of silica, zirconia and titania, and
    wherein a plurality of said inorganic particles are attached to a surface of each of said polymer particles, and a ratio (Sp/Si) of a mean particle site of said polymer particles (Sp) and a mean particle size of said inorganic particles (Si) is from 1 to 40, and
    the mean particle size of the composite particles is 0.1 to 1.0 μm.

12. The dispersion according to claim 11, wherein said inorganic particles are silica, and the pH of said aqueous dispersion is from 2.5 to 8.5.

13. The dispersion according to claim 11, wherein said inorganic particles are zirconia, and the pH of said aqueous dispersion is from 4 to 8.5.

14. The dispersion according to claim 11, wherein said inorganic particles are titania, and the pH of said aqueous dispersion is from 6.5 to 8.5.

15. The dispersion according to claim 11, wherein a ratio (Sp/Si) of a mean particle size of said polymer particles (Sp) and a mean particle size of said inorganic particles (Si) is from 1.5 to 20.

16. The dispersion according to claim 11, wherein a ratio (Wp/Wi) of a content of said polymer particles (Wp) and a content of said inorganic particles (Wi) is from 0.05 to 1.

17. The dispersion according to claim 11, further comprising a surfactant, wherein a content of said surfactant is not greater than 0.15 wt %.

18. The dispersion according to claim 17, further comprising an oxidizing agent, a polyvalent metal ion, or a combination thereof.

19. The dispersion according to claim 18, further comprising an organic acid.

20. The dispersion according to claim 11, wherein the mean particle size of the polymer particles and the inorganic particles is 0.01 to 1.0 μm.

21. A dispersion comprising polymer particles, inorganic particles and water, wherein the zeta potential of said polymer particles and the zeta potential of said inorganic particles are of opposite signs, said polymer particles and said inorganic particles are electrostatically bonded to form composite particles,
    wherein said polymer particles have at least one functional group selected from the group consisting of a carboxyl group, an anion of a carboxyl groups, a sulfonic acid group and an anion of a sulfonic acid group, and said inorganic particles are alumina, titania, or a combination thereof, and a plurality of said inorganic particles are attached to a surface of each of said polymer particles, and
    wherein a ratio (Sp/Si) of a mean particle size of said polymer particles (Sp) and a mean particle size of said inorganic particles (Si) is from 1 to 40, said composite particles are obtained after ultrasonic irradiation treatment or mechanical shear stress treatment with a homogenizer, and a mean particle size of said composite particles is not greater than 1 μm.

22. A dispersion comprising polymer particles, inorganic particles and water, wherein the zeta potential of said polymer particles and the zeta potential of said inorganic particles are of opposite signs, said polymer particles and said inorganic particles are electrostatically bonded to form composite particles, wherein said polymer particles have at least one functional group selected from the group consisting of a cation-formable nitrogen-containing group and a cation of a cation-formable nitrogen-containing group, and said inorganic particles are selected from the group consisting of silica, zirconia and titania, and wherein a plurality of said inorganic particles are attached to a surface of each of said polymer particles, and a ratio (Sp/Si) of a mean particle size of said polymer particles (Sp) and a mean particle size of said inorganic particles (Si) is from 1 to 40, said composite particles are obtained after ultrasonic irradiation treatment or mechanical shear stress treatment with a homogenizer, and a mean particle size of said composite particles is not greater than 1 μm.

wherein said polymer particles have at least one functional group selected from the group consisting of cation-formable nitrogen-containing groups and cations of cation-formable nitrogen-containing groups, and said inorganic particles are selected from the group consisting of silica, zirconia and titania.

* * * * *

UNITED STATES PATENT AND TRADEMARK OFFICE
CERTIFICATE OF CORRECTION

PATENT NO. : 6,740,590 B1
DATED : May 25, 2004
INVENTOR(S) : Yano et al.

It is certified that error appears in the above-identified patent and that said Letters Patent is hereby corrected as shown below:

<u>Title page, Item [54] and Column 1, lines 1-5,</u>
Title, should read:
-- AQUEOUS DISPERSION, AQUEOUS DISPERSION FOR CHEMICAL MECHANICAL POLISHING USED FOR MANUFACTURE OF SEMICONDUCTOR DEVICES, METHOD FOR MANUFACTURE OF SEMICONDUCTOR DEVICES, AND METHOD FOR FORMATION OF EMBREDDED WIRING --

Signed and Sealed this

Fifteenth Day of February, 2005

JON W. DUDAS
*Director of the United States Patent and Trademark Office*

UNITED STATES PATENT AND TRADEMARK OFFICE
CERTIFICATE OF CORRECTION

PATENT NO. : 6,740,590 B1 Page 1 of 1
DATED : May 25, 2004
INVENTOR(S) : Yano et al.

It is certified that error appears in the above-identified patent and that said Letters Patent is hereby corrected as shown below:

Title page, Item [54] and Column 1, lines 1-5,
Title, should read:
-- AQUEOUS DISPERSION, AQUEOUS DISPERSION FOR CHEMICAL MECHANICAL POLISHING USED FOR MANUFACTURE OF SEMICONDUCTOR DEVICES, METHOD FOR MANUFACTURE OF SEMICONDUCTOR DEVICES, AND METHOD FOR FORMATION OF EMBEDDED WIRING --

This certificate supersedes Certificate of Correction issued February 15, 2005.

Signed and Sealed this

Nineteenth Day of April, 2005

JON W. DUDAS
*Director of the United States Patent and Trademark Office*